(12) United States Patent
Pendharkar et al.

(10) Patent No.: US 9,431,286 B1
(45) Date of Patent: Aug. 30, 2016

(54) DEEP TRENCH WITH SELF-ALIGNED SINKER

(71) Applicant: Texas Instruments Incorporated, Dallas, TX (US)

(72) Inventors: Sameer P Pendharkar, Allen, TX (US); Binghua Hu, Plano, TX (US); Abbas Ali, Plano, TX (US); Henry Litzmann Edwards, Garland, TX (US); John P. Erdeljac, Plano, TX (US); Britton Robbins, McKinney, TX (US); Jarvis Benjamin Jacobs, Murphy, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 37 days.

(21) Appl. No.: 14/555,209

(22) Filed: Nov. 26, 2014

(51) Int. Cl.
| | | |
|---|---|---|
| *H01L 21/76* | (2006.01) | |
| *H01L 21/761* | (2006.01) | |
| *H01L 29/06* | (2006.01) | |
| *H01L 21/263* | (2006.01) | |

(52) U.S. Cl.
CPC ........... *H01L 21/761* (2013.01); *H01L 21/263* (2013.01); *H01L 29/0646* (2013.01)

(58) Field of Classification Search
CPC  H01L 21/263; H01L 21/761; H01L 29/0646
USPC ................... 438/359, 361, 424, 430
See application file for complete search history.

(56) References Cited

U.S. PATENT DOCUMENTS

| | | | | |
|---|---|---|---|---|
| 7,135,380 B2* | 11/2006 | Onai | ...................... | H01L 21/763 257/E21.546 |
| 7,723,204 B2* | 5/2010 | Khemka | ................ | H01L 21/763 257/E21.572 |
| 2004/0171220 A1* | 9/2004 | Yang | ...................... | H01L 21/763 438/270 |

* cited by examiner

*Primary Examiner* — Hung Vu
(74) *Attorney, Agent, or Firm* — Jacqueline J. Garner; Frank D. Cimino

(57) ABSTRACT

A semiconductor device with a buried layer has a deep trench structure abutting the buried layer and a self-aligned sinker along sidewalls of the deep trench structure. The semiconductor device may be formed by forming a portion of a deep trench down to the buried layer, and implanting dopants into a substrate of the semiconductor device along sidewalls of the deep trench, and subsequently forming a remainder of the deep trench extending below the buried layer. Alternatively, the semiconductor device may be formed by forming the deep trench to extend below the buried layer, and subsequently implanting dopants into the substrate of the semiconductor device along sidewalls of the deep trench.

7 Claims, 16 Drawing Sheets

DEEP TRENCH WITH SELF-ALIGNED SINKER

FIELD OF THE INVENTION

This invention relates to the field of semiconductor devices. More particularly, this invention relates to deep trenches in integrated circuits.

BACKGROUND OF THE INVENTION

A semiconductor device includes a buried layer and a sinker to prove an electrical connection to the buried layer. The sinker is formed by implanting dopants in one or more doses followed by activation anneals. Lateral straggle of the implanted dopants and diffusion of the dopants during the activation anneal causes the sinker to have an undesirably large lateral dimension, disadvantageously affecting the size of the semiconductor device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device with a buried layer has a deep trench structure abutting the buried layer and a self-aligned sinker along sidewalls of the deep trench structure. The semiconductor device may be formed by forming a portion of a deep trench down to the buried layer, and implanting dopants into a substrate of the semiconductor device along sidewalls of the deep trench, and subsequently forming a remainder of the deep trench extending below the buried layer. Alternatively, the semiconductor device may be formed by forming the deep trench to extend below the buried layer, and subsequently implanting dopants into the substrate of the semiconductor device along sidewalls of the deep trench.

DETAILED DESCRIPTION OF EXAMPLE EMBODIMENTS

The following co-pending patent applications are related and hereby incorporated by reference: U.S. patent application Ser. No. 14/555,300, U.S. patent application Ser. No. 14/555,330, and U.S. patent application Ser. No. 14/555,359, all filed simultaneously with this application).

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
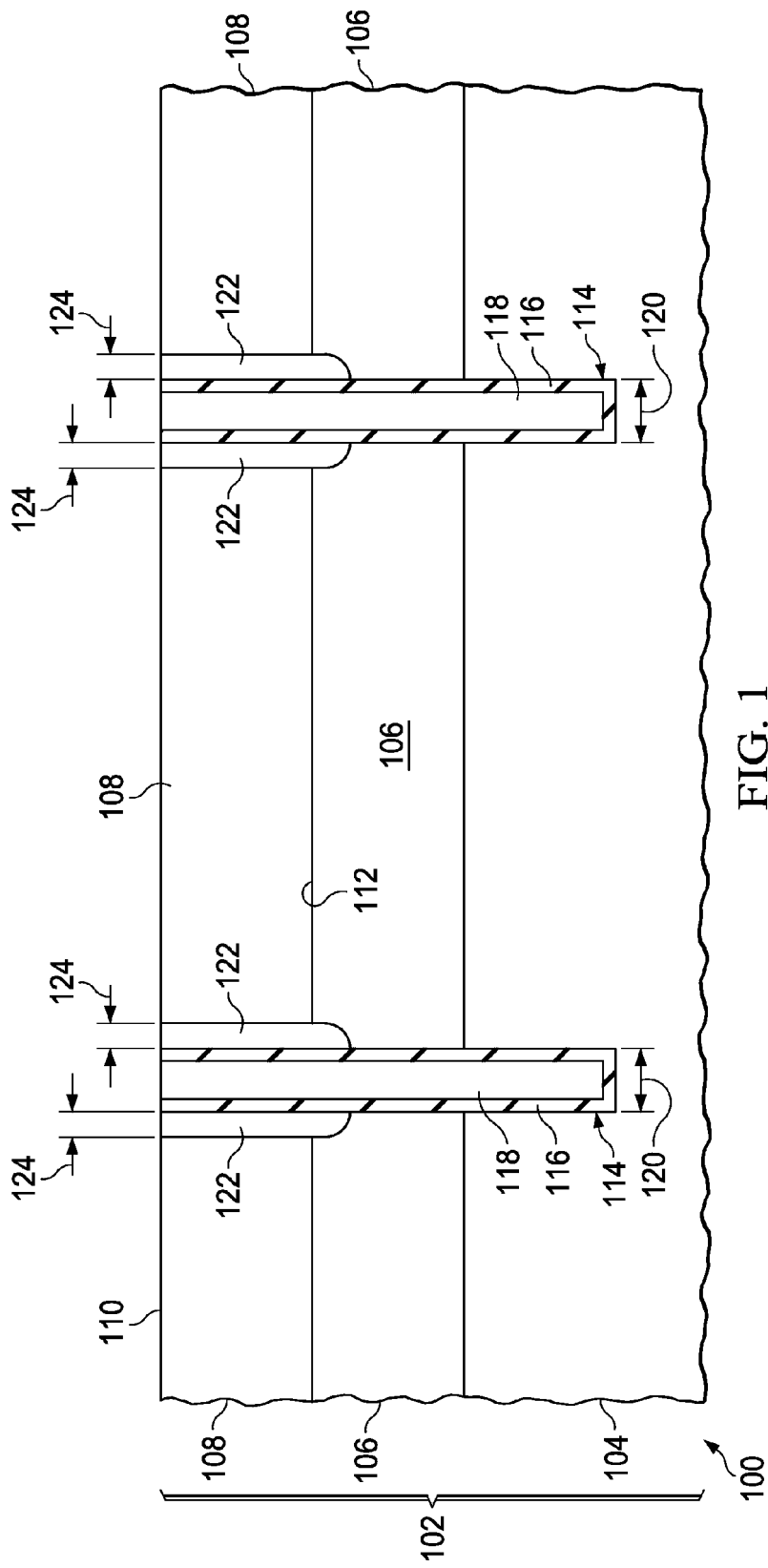
FIG. 1 is a cross section of an example semiconductor device containing a buried layer and a deep trench with a self-aligned sinker to the buried layer.

FIG. 1 is a cross section of an example semiconductor device containing a buried layer and a deep trench with a self-aligned sinker to the buried layer. The semiconductor device 100 is formed in a substrate 102 comprising a base semiconductor layer 104, a buried layer 106 of semiconductor material and an upper semiconductor layer 108 extending to a top surface 110 of the substrate 102. The base semiconductor layer 104 may be, for example, a bulk silicon wafer, an epitaxial layer on a bulk silicon wafer, a silicon-on-insulator (SOI) wafer. The buried layer 106 may have an average doping density of at least $1 \times 10^{18}$ cm-3 and commonly has an opposite conductivity type from the base semiconductor layer 104. A top surface 112 of the buried layer 106 is at least 2 microns below the top surface 110 of the substrate 102, and may extend 5 microns to 10 microns below the top surface 110 of the substrate 102. The buried layer 106 may extend laterally across the semiconductor device 100 as depicted in FIG. 1, or may be limited in lateral extent. The upper semiconductor layer 108 may be an epitaxial layer formed on the buried layer. The upper semiconductor layer 108 extends to the top surface 110 of the substrate 102 and commonly has the opposite conductivity type from the buried layer 106. In the instant example, the base semiconductor layer 104 is p-type, the buried layer 106 is n-type and the upper semiconductor layer 108 is p-type.

One or more deep trench structures 114 are disposed in the substrate 102, extending below the buried layer 106 into the base semiconductor layer 104. The deep trench structures 114 include dielectric liners 116 on sides and a bottom, contacting the substrate 102. The dielectric liners 116 may include thermal silicon dioxide. The deep trench structures 114 include trench fill material 118 on the dielectric liners 116; the trench fill material 118 is isolated from the substrate 102 by the dielectric liner 116. In the instant example, the trench fill material 118 is an electrically conductive material such as polycrystalline silicon, referred to as polysilicon. In an alternate version of the instant example, the trench fill material 118 may be dielectric material such as silicon dioxide. The deep trench structures 114 have widths 120 of less than 6 microns, for example, 1 micron to 4 microns.

Self-aligned sinkers 122 are disposed in the upper semiconductor layer 108 abutting the deep trench structures 114 and extending to the buried layer 106. The self-aligned sinkers 122 have the same conductivity type as the buried layer 106, so as to provide electrical connections to the buried layer 106; in the instant example, the self-aligned sinkers 122 are n-type. The self-aligned sinkers 122 extend laterally from the deep trench structures 114 by a thickness 124 of less than 2.5 microns, which may advantageously enable a reduced size of the semiconductor device 100 compared to a semiconductor device using conventional sinkers.

An alternate semiconductor device with a p-type buried layer and a deep trench structure with a p-type self-aligned sinker to the p-type buried layer may be obtained by appropriate reversal of polarities of conductivity types and dopants from the structure of FIG. 1. A semiconductor device with an n-type buried layer and a first deep trench structure with an n-type self-aligned sinker to the n-type buried layer, and a p-type buried layer and a deep trench structure with a p-type self-aligned sinker to the p-type buried layer, is within the scope of the instant invention.

Figure 2A:
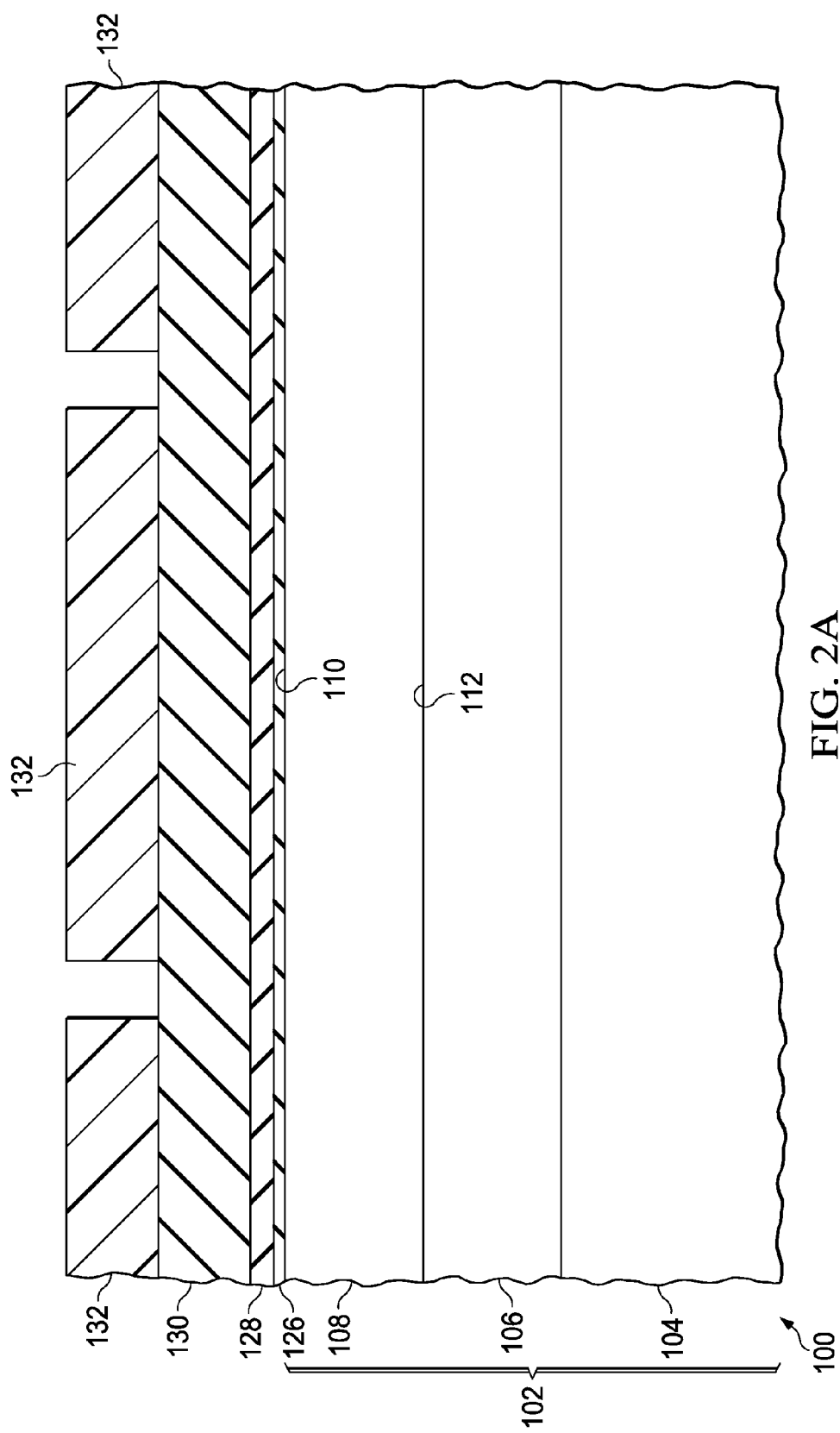
FIG. 2A through FIG. 2F are cross sections of the semiconductor device of FIG. 1, depicted in successive stages of fabrication of a first example formation process.

FIG. 2A through FIG. 2F are cross sections of the semiconductor device of FIG. 1, depicted in successive stages of fabrication of an example formation process. Referring to FIG. 2A, the buried layer 106 and the upper semiconductor layer 108 are formed on the base semiconductor layer 104. The buried layer 106 and the upper semiconductor layer 108 may be formed by implanting n-type dopants into the p-type base semiconductor layer 104, followed by a thermal drive and a subsequent epitaxial process to grow the p-type upper semiconductor layer 108, so that the buried layer 106 is formed by diffusion and activation of the implanted n-type dopants.

A layer of pad oxide 126 is formed at the top surface 110 of the substrate, for example by thermal oxidation. The layer of pad oxide 126 may include 5 nanometers to 30 nanometers of silicon dioxide. A layer of pad nitride 128 is formed on the layer of pad oxide 126, for example by low pressure chemical vapor deposition (LPCVD) using ammonia and silane. The layer of pad nitride 128 may include 100 nanometers to 300 nanometers of silicon nitride. A layer of hard mask oxide 130 is formed over the layer of pad nitride 128, for example by a plasma enhanced chemical vapor deposition (PECVD) using tetraethyl orthosilicate, also called tetraethoxysilane (TEOS), or using a high density plasma (HDP) process. The layer of hard mask oxide 130 may include 500 nanometers to 2 microns of silicon dioxide. The layer of pad nitride 128 provides an etch stop layer for subsequent etching of the layer of hard mask oxide 130.

A trench mask 132 is formed over the layer of hard mask oxide 130 so as to expose areas for the deep trench structures 114 of FIG. 1. The trench mask 132 may include photoresist formed by a photolithographic process, and may further include a hard mask layer and/or an anti-reflection layer.

Figure 2B:
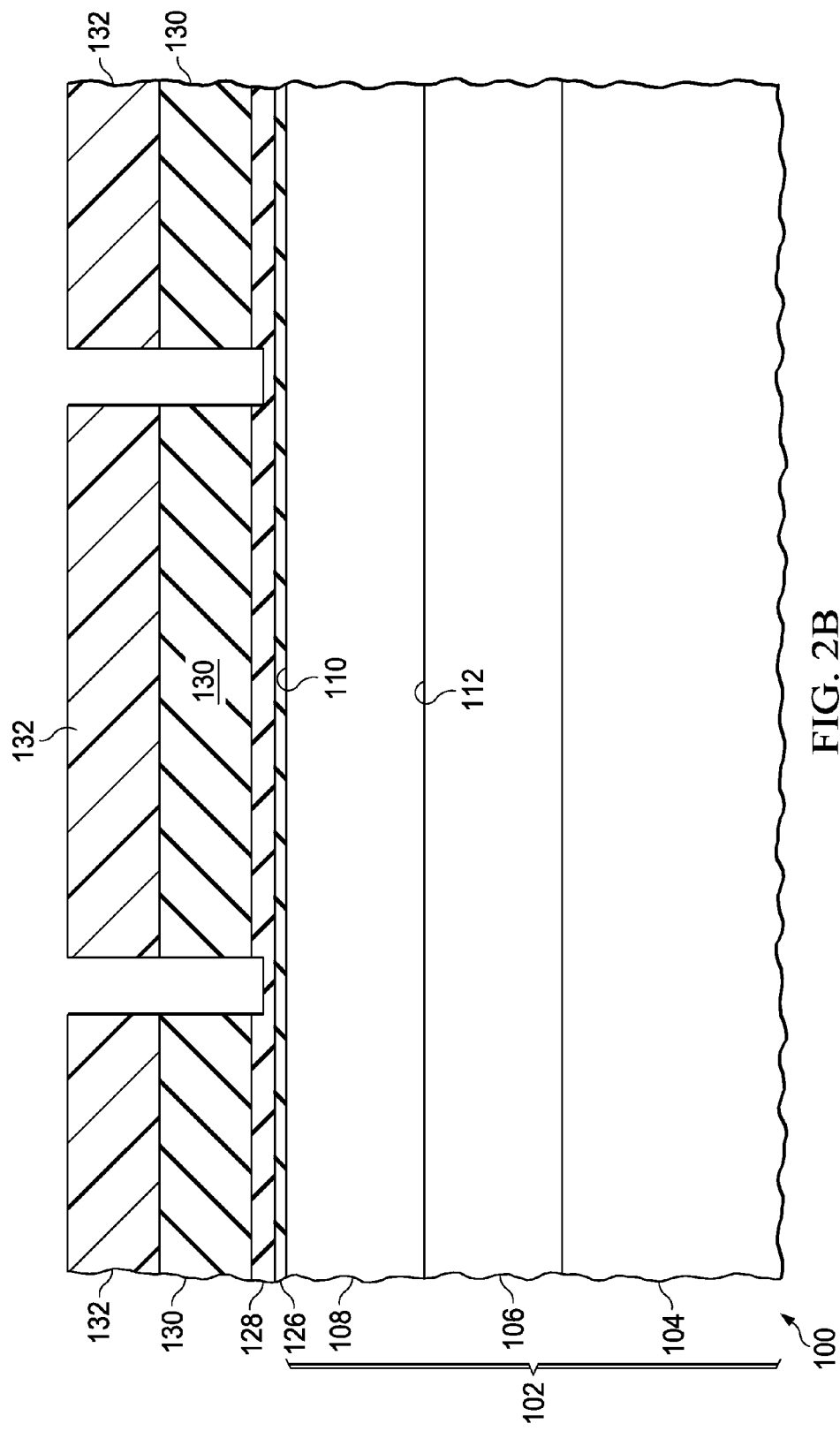

Referring to FIG. 2B, a hard mask etch process removes material from the layer of hard mask oxide 130 in the areas exposed by the trench mask 132. The hard mask etch process may include a reactive ion etch (RIE) process using fluorine radicals, and/or may include a wet etch process using a dilute buffered aqueous solution of hydrofluoric acid. A portion of the layer of pad nitride 128 may be removed by the hard mask etch process, as depicted in FIG. 2B. A portion or all of the trench mask 132 may be eroded by the hard mask etch process.

Figure 2C:
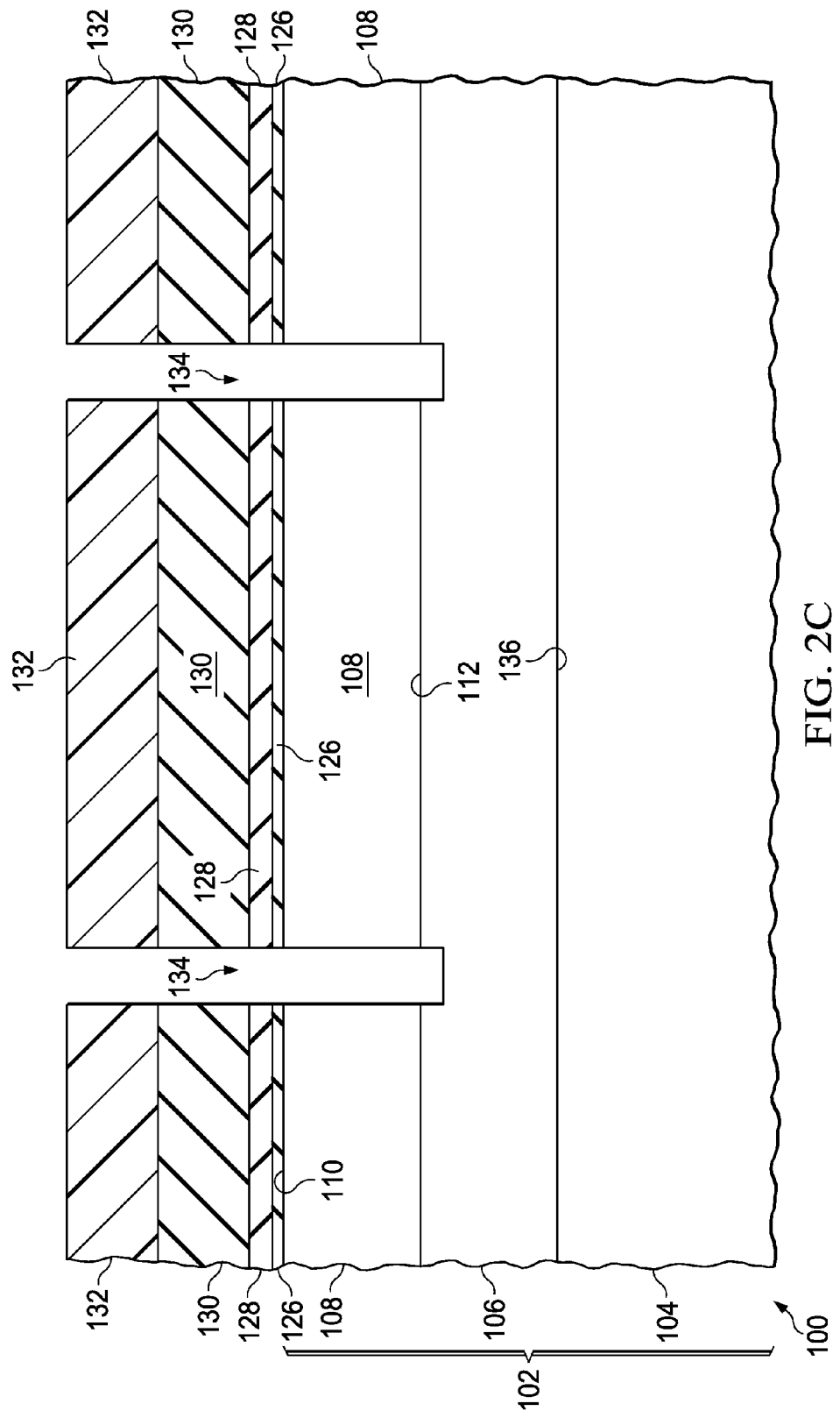

Referring to FIG. 2C, a stop layer etch process removes the layer of pad nitride 128 and the layer of pad oxide 126 in the areas exposed by the trench mask 132. The stop layer etch process may include an RIE process with a different combination of gases from the hard mask etch process discussed in reference to FIG. 2B. The trench mask 132 may be additionally eroded by the stop layer etch process.

A first trench etch process removes material from the substrate 102 in the areas exposed by the trench mask 132 to form partial deep trenches 134 which extend to the buried layer 106. The first trench etch process may include a continuous etch process which simultaneously removes material from bottoms of the partial deep trenches 134 and passivates sidewalls of the partial deep trenches 134. Alternatively, the first deep trench etch process may include an iterated two-step process which removes material from the bottoms of the partial deep trenches 134 in a first step and passivates sidewalls of the partial deep trenches 134 in a second step. In the instant example, the partial deep trenches 134 do not extend deeper than a bottom surface 136 of the buried layer 106. The trench mask 132 may be additionally eroded by the first trench etch process.

Figure 2D:
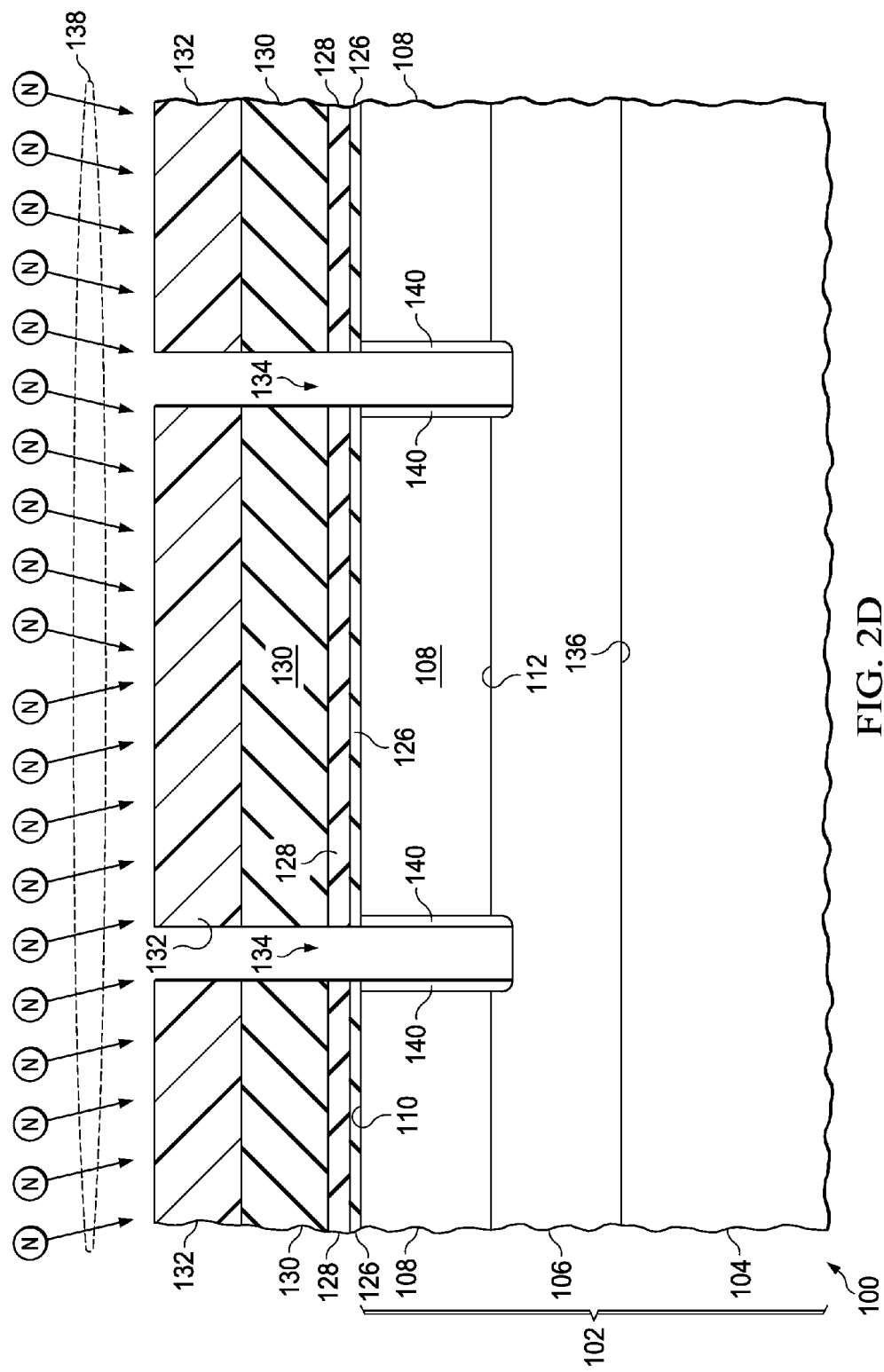

Referring to FIG. 2D, n-type dopants 138 are implanted into the substrate 102 along the sidewalls of the partial deep trenches 134 to form n-type sinker implanted layers 140. The n-type dopants 138 may be implanted in multiple sub-doses at tilt angles, for example, 10 degrees to 30 degrees, to provide continuous coverage of the sinker implanted layers 140 along the sidewalls of the partial deep trenches 134. The n-type dopants 138 may be implanted at twist angles of about 45 degrees to reduce the amount of the n-type dopants 138 implanted into bottom surfaces of the partial deep trenches 134, as depicted in FIG. 2D. An example implant process may include four sub-doses rotated 90 degrees apart, at tilt angles of 10 degrees to 30 degrees and twist angles of 45 degrees. Reducing the amount of the n-type dopants 138 implanted into bottom surfaces of the partial deep trenches 134 may advantageously improve process margin of a subsequent second trench etch process. The n-type dopants 138 may be implanted at a total dose of $1 \times 10^{15}$ cm$^{-2}$ to $2 \times 10^{16}$ cm$^{-2}$ so as to provide desirably low resistance of the subsequent formed self-aligned sinkers. The n-type dopants 138 may include phosphorus and/or arsenic. A pad oxide layer, not shown in FIG. 2D, may be formed on the sidewalls of the partial deep trenches 134. If n-type dopants 138 include arsenic, a pad oxide layer of 30 nanometers of silicon dioxide formed by a PECVD process using TEOS may improve retention of the implanted arsenic in the sinker implanted layers 140. Alternatively, if the n-type dopants 138 do not include arsenic, a pad oxide on the sidewalls of the partial deep trenches 134 may be omitted, as the pad oxide undesirably increases stress in the substrate 102, possibly degrading performance of the semiconductor device 100. In the instant example, implanting the n-type dopants 138 after forming the partial deep trenches 134 and before forming deeper trenches advantageously limits the sinker implanted layers 140 to extend only as far as the buried layer 106 and not deeper, which may improve a breakdown voltage in the semiconductor device 100.

Figure 2E:
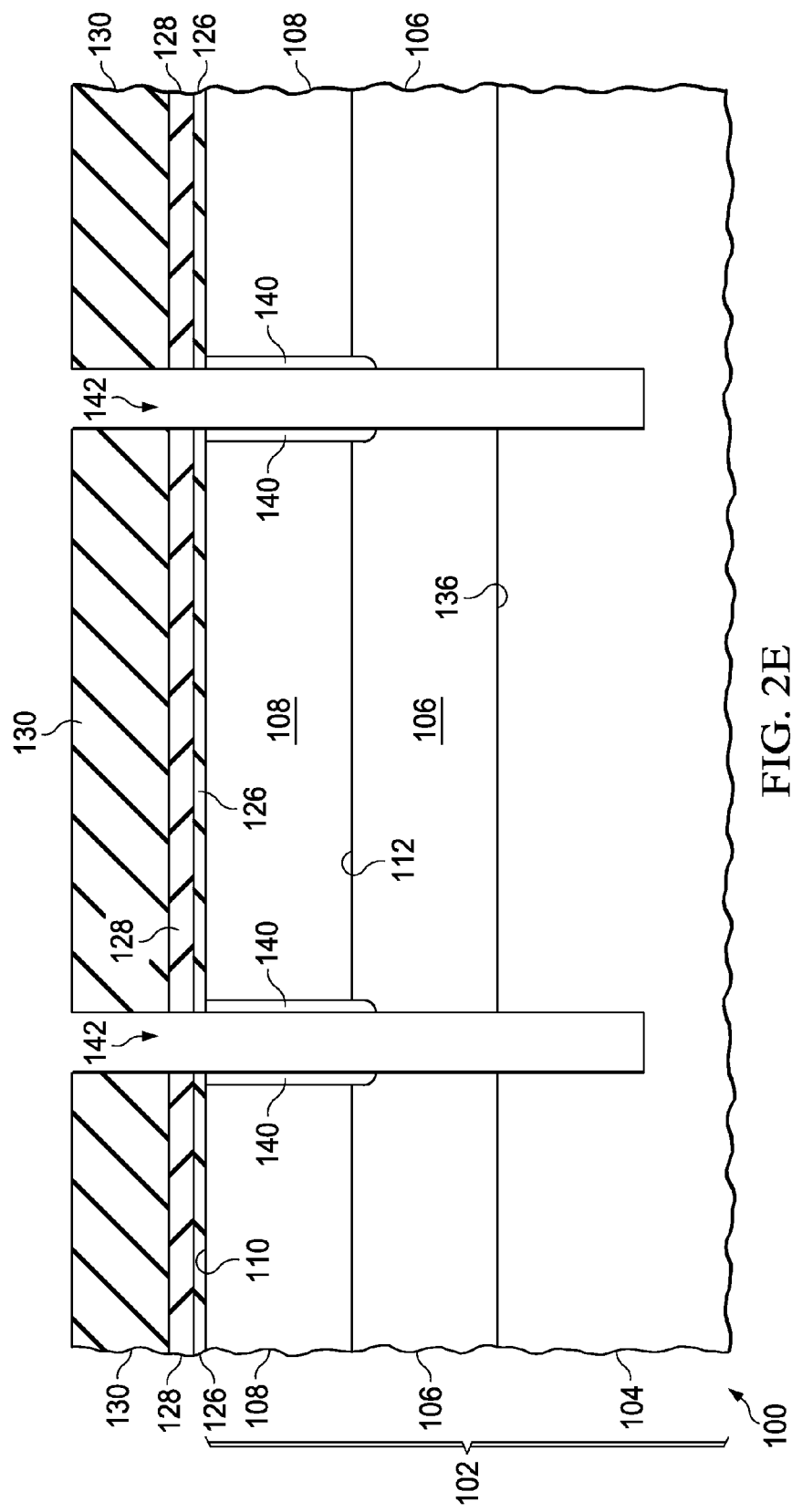

Referring to FIG. 2E, a second trench etch process removes more material from the substrate 102 so as to extend the partial deep trenches 134 of FIG. 2D to below the bottom surface of the buried layer 106 to form deep trenches 142. The deep trenches 142 may be, for example, 12 microns to 35 microns deep. Substantially all of the remaining trench mask 132 of FIG. 2D may be eroded by the second trench etch process, as depicted in FIG. 2E.

Figure 2F:
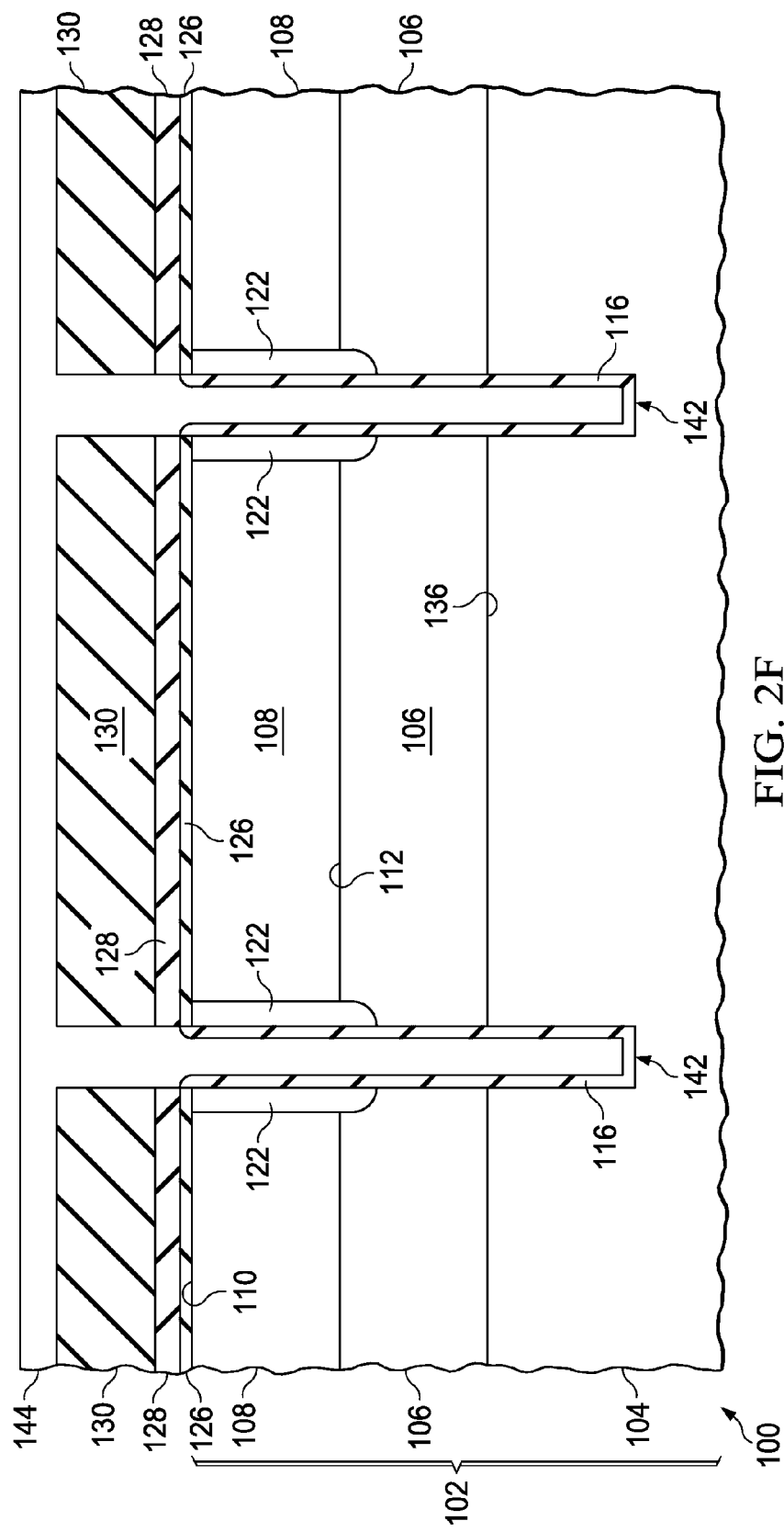

Referring to FIG. 2F, the dielectric liner 116 is formed on the sides and bottoms of the deep trenches 142. The dielectric liner 116 may be, for example, 100 nanometers to 800 nanometers thick. The dielectric liner 116 may be formed, for example, by forming a layer thermal oxide 200 nanometers to 300 nanometers thick on the sides and bottoms of the deep trenches 142 followed by a layer of silicon dioxide 300 nanometers to 500 nanometers thick formed on the thermal oxide by a sub-atmospheric chemical vapor deposition (SACVD) process. A layer of trench fill material 144 is formed in the deep trenches 142 on the dielectric liner 116. In the instant example, the layer of trench fill material 144 may be polysilicon, formed in the deep trenches 142 and extending over the layer of hard mask oxide 130. Alternatively, the layer of trench fill material 144 may be silicon dioxide or other dielectric material.

Thermal profiles during formation of the dielectric liner 116 and the layer of trench fill material 144 cause the implanted n-type dopants in the sinker implanted layers 140 of FIG. 2E to diffuse and become activated, to form the self-aligned sinkers 122. In the instant example, a separate activation anneal for the implanted n-type dopants is not performed.

The layer of hard mask oxide 130 and the overlying portion of the layer of trench fill material 144 are subsequently removed, for example by a chemical mechanical polish (CMP) process, leaving the layer of trench fill material 144 in the deep trenches 142 to provide the trench fill material 118 of FIG. 1. The layer of pad nitride 128 provides a stop layer for removal of the layer of hard mask oxide 130. The layer of pad nitride 128 and the layer of pad oxide 126 are subsequently removed, to provide the structure of FIG. 1.

Figure 3A:
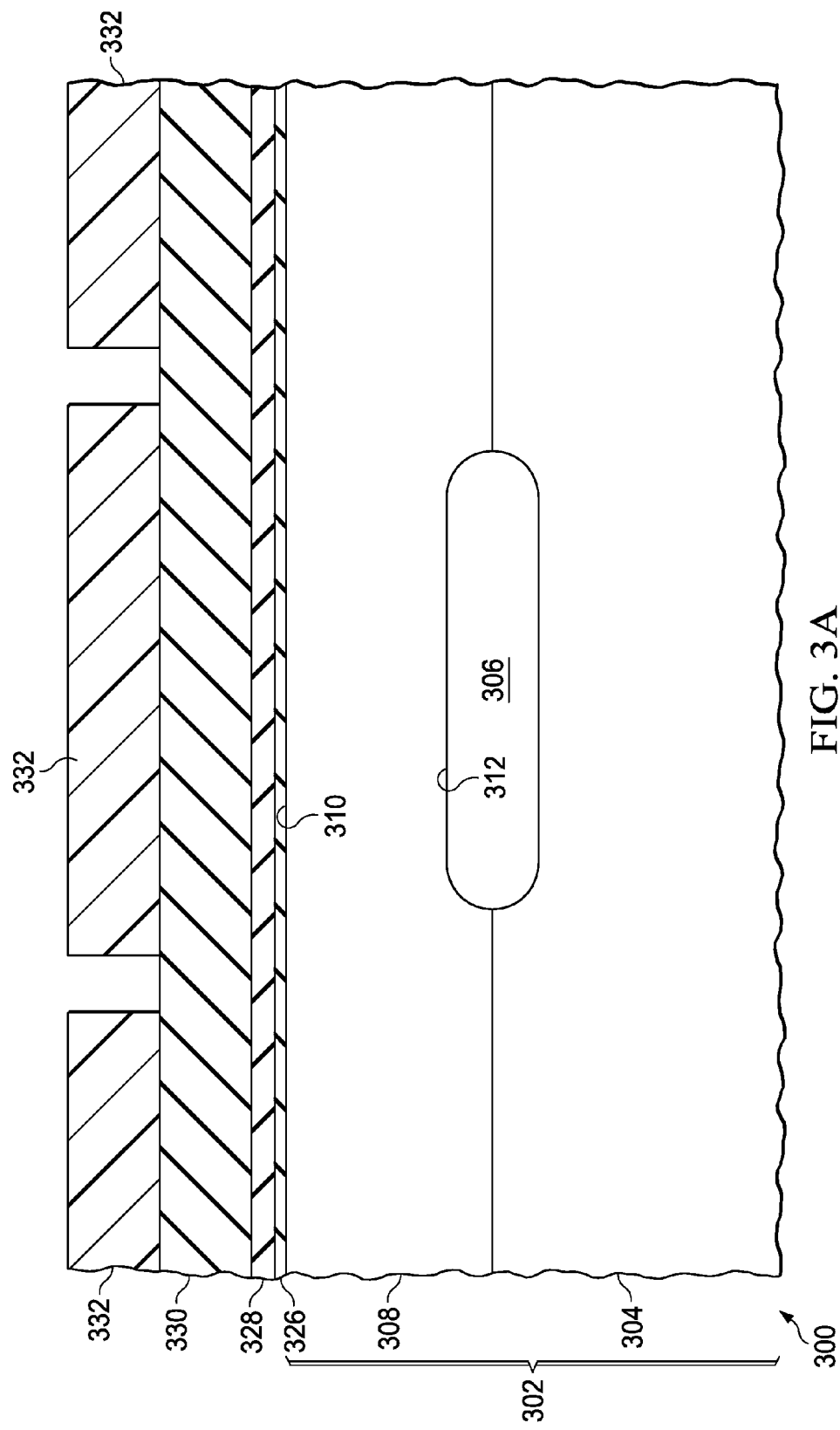
FIG. 3A through FIG. 3F are cross sections of another example semiconductor device containing a buried layer and a deep trench with a self-aligned sinker to the buried layer, depicted in successive stages of fabrication of another example formation process.

FIG. 3A through FIG. 3F are cross sections of another example semiconductor device containing a buried layer and deep trench structures with a self-aligned sinker to the buried layer, depicted in successive stages of fabrication of another example formation process. Referring to FIG. 3A, the semiconductor device 300 is formed in a substrate 302 comprising a base semiconductor layer 304, a buried layer 306 of semiconductor material and an upper semiconductor layer 308 extending to a top surface 310 of the substrate 302. The base semiconductor layer 304 may be a p-type semiconductor similar to that described in reference to FIG. 1. The buried layer 306 may be localized as depicted in FIG. 3A, and n-type with an average doping density of at least $1 \times 10^{18}$ cm$^{-3}$. Alternatively, the buried layer 306 may extend laterally across the semiconductor device 300 as depicted in FIG. 1. A top surface 312 of the buried layer 306 is at least 2 microns below the top surface 310 of the substrate 302, and may extend 5 microns to 10 microns below the top surface 310 of the substrate 302. The upper semiconductor layer 308 extends to the top surface 310 of the substrate 302. The buried layer 306 and the upper semiconductor layer 308 may be formed as described in reference to FIG. 1.

A layer of pad oxide 326 including 5 nanometers to 30 nanometers of silicon dioxide is formed at the top surface 310 of the substrate. A layer of pad nitride 328 including 100 nanometers to 300 nanometers of silicon nitride is formed on the layer of pad oxide 326. A layer of hard mask oxide 330 including 500 nanometers to 2 microns of silicon dioxide is formed over the layer of pad nitride 328.

A trench mask 332 is formed over the layer of hard mask oxide 330 so as to expose areas for the deep trench structures. In the instant example, the areas for the deep trench structures are located over lateral edges of the buried layer 306. The trench mask 332 may include photoresist formed by a photolithographic process, and may further include a hard mask layer and/or an anti-reflection layer.

Figure 3B:
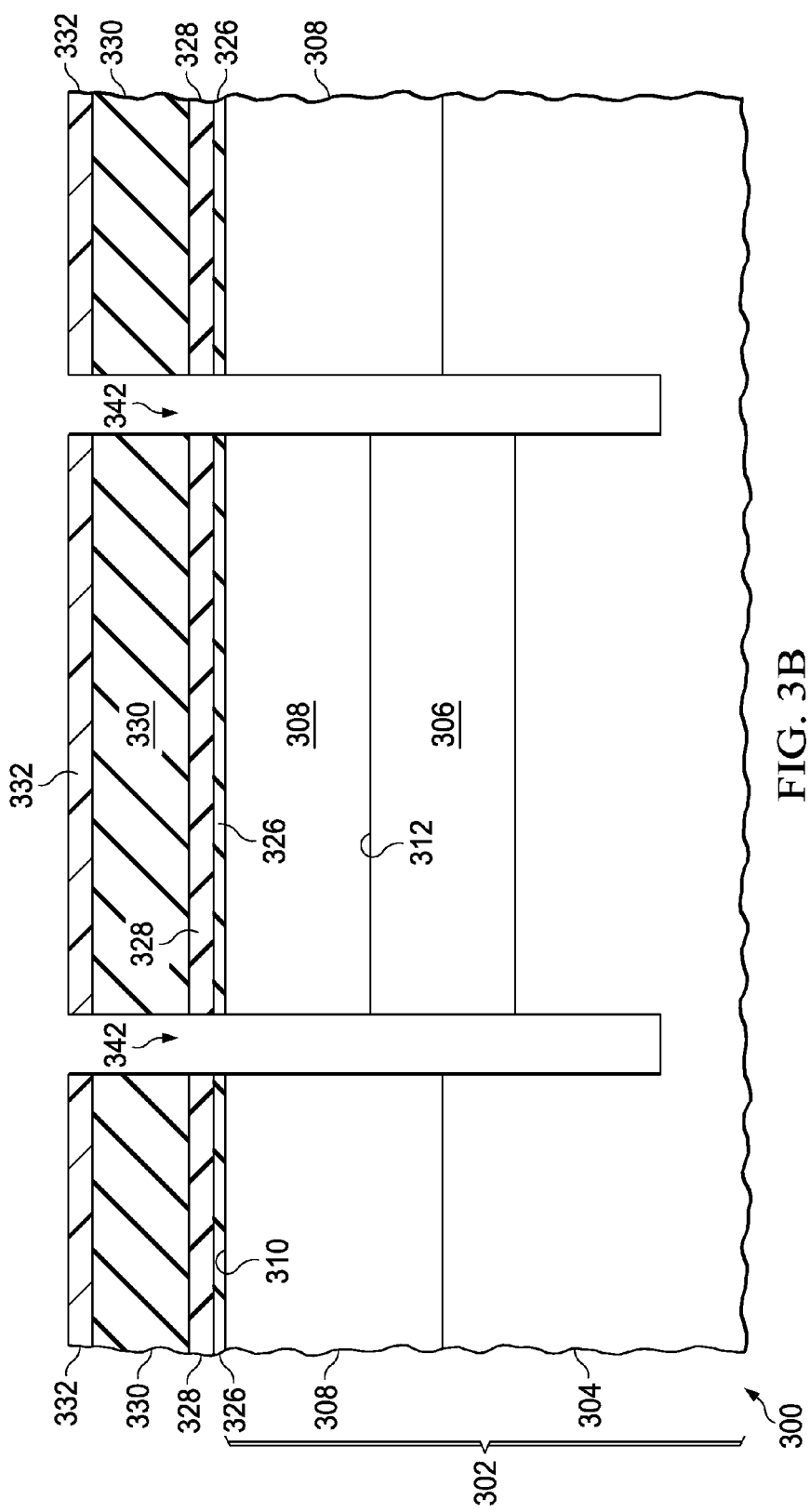

Referring to FIG. 3B, a hard mask etch process removes material from the layer of hard mask oxide 330 in the areas exposed by the trench mask 332. Subsequently, a stop layer etch process removes the layer of pad nitride 328 and the layer of pad oxide 326 in the areas exposed by the trench mask 332. A trench etch process removes material from the substrate 302 in the areas exposed by the trench mask 332 to form deep trenches 342 which extend to below the bottom surface of the buried layer 306. The deep trenches 342 may be, for example, 12 microns to 35 microns deep. A significant portion, as depicted in FIG. 3B, and possibly all of the trench mask 332, and possibly a portion of the layer of hard mask oxide 330, may be eroded by the trench etch process. Any remaining trench mask 332 is removed after the deep trenches 342 are formed.

Figure 3C:
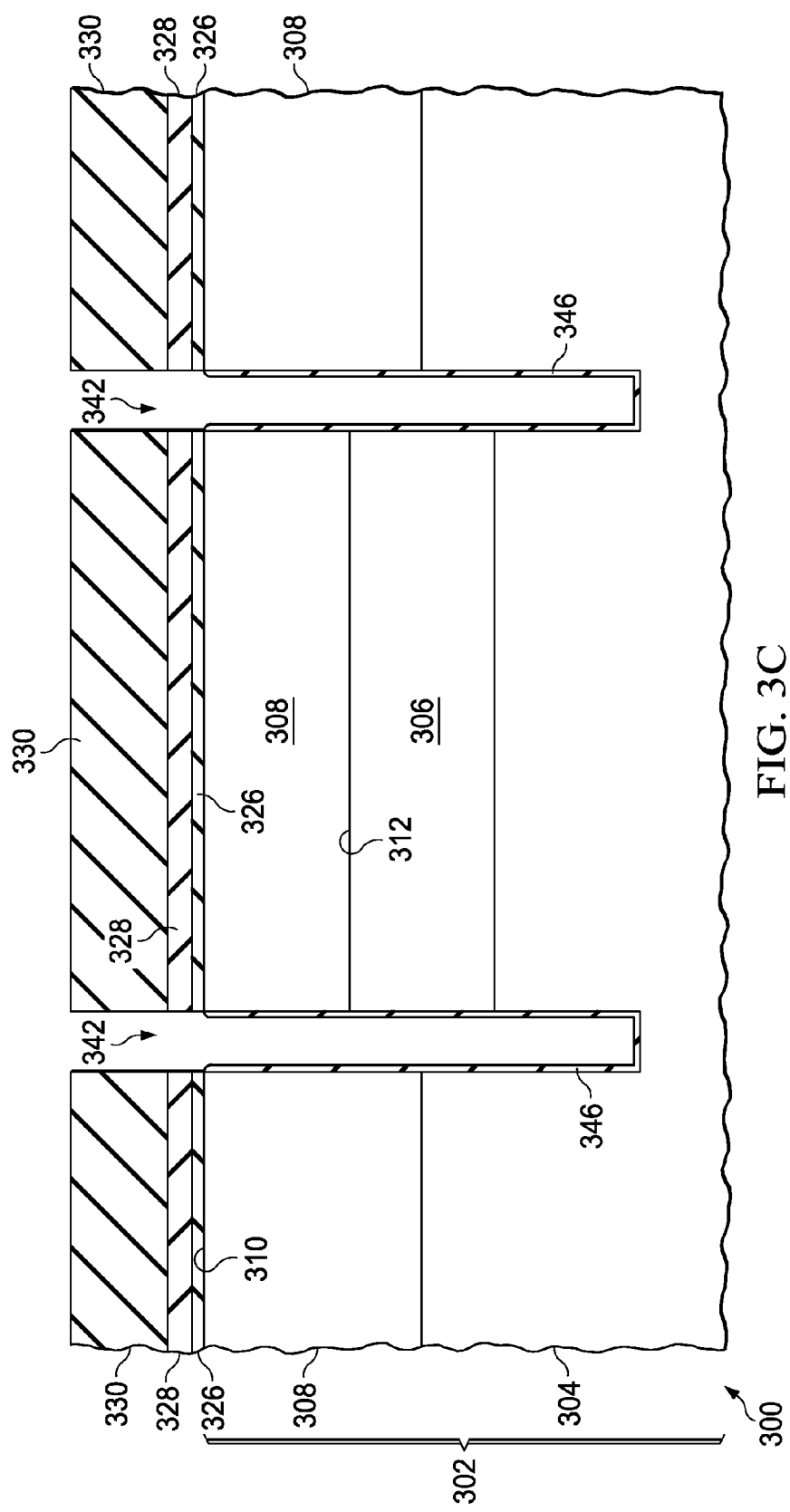

Referring to FIG. 3C, a layer of pad oxide 346 is formed on sidewalls of the deep trenches 342, for example by thermal oxidation. The layer of pad oxide 346 may be, for example, 5 nanometers to 30 nanometers thick.

Figure 3D:
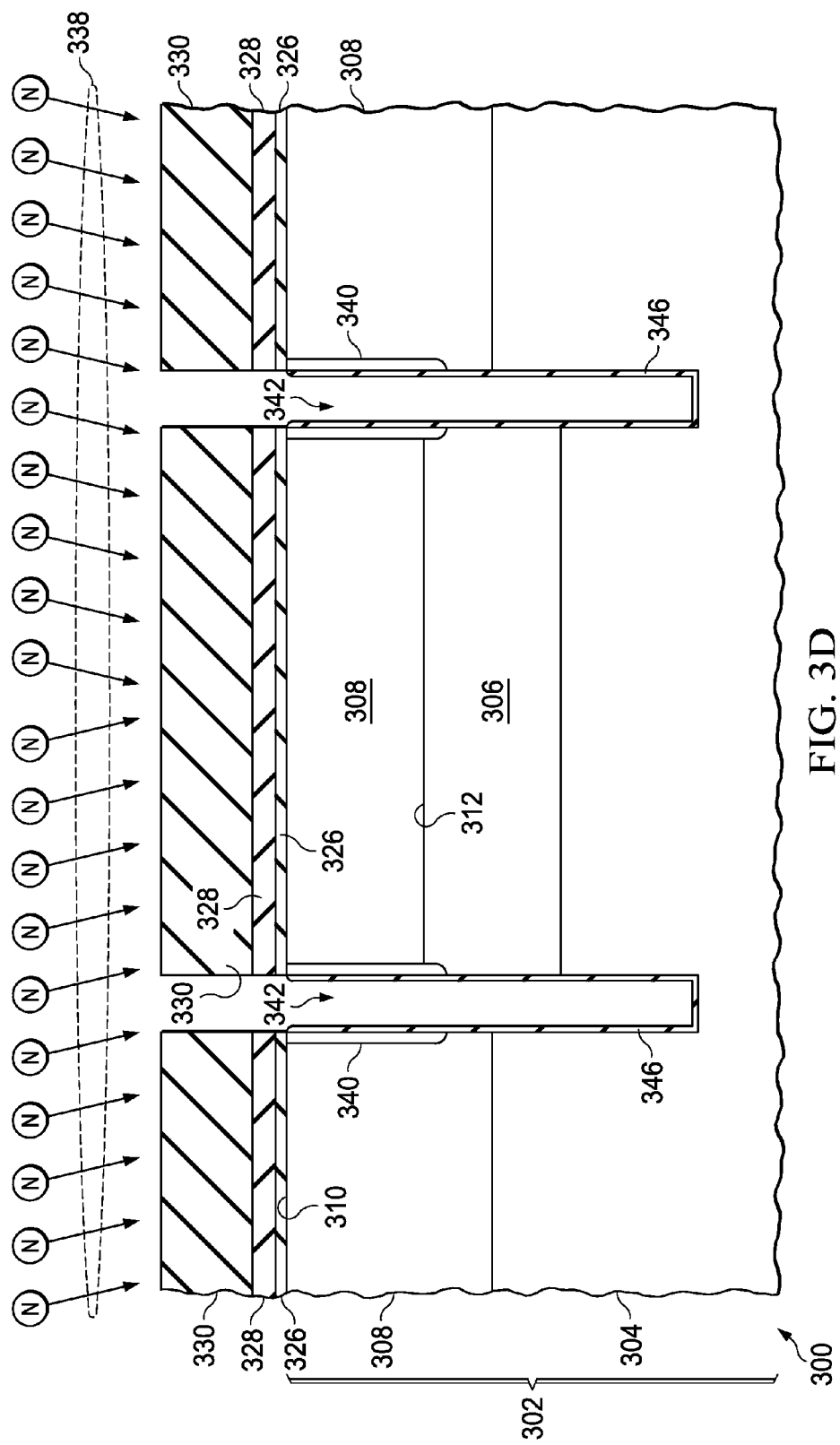

Referring to FIG. 3D, n-type dopants 338 are implanted through the layer of pad oxide 346 into the substrate 302 along the sidewalls of the deep trenches 342 to form n-type sinker implanted layers 340. The n-type dopants 338 may be implanted as described in reference to FIG. 2D. In the instant example, implanting the n-type dopants 338 at tilt angles above 10 degrees may advantageously limit the sinker implanted layers 340 to extend only as far as the buried layer 306. Forming the deep trenches 342 in one trench etch operation advantageously reduces process complexity and fabrication cost of the semiconductor device 300. Forming the layer of pad oxide 346 may advantageously help retain arsenic in the implanted n-type dopants 338.

Figure 3E:
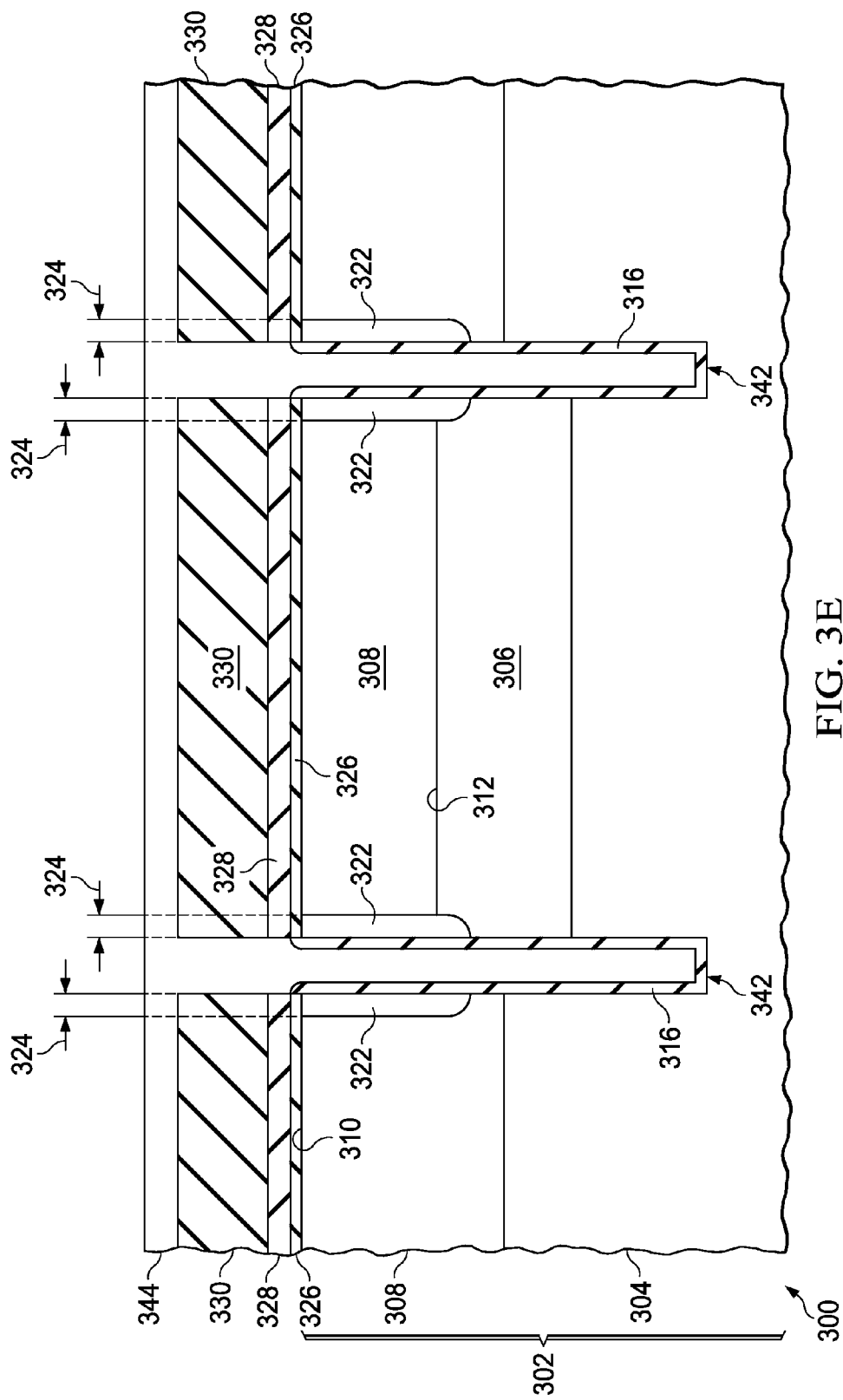

Referring to FIG. 3E, an activation anneal causes the implanted n-type dopants in the sinker implanted layers 340 of FIG. 3D to diffuse and become activated, to form self-aligned sinkers 322 in the upper semiconductor layer 308 abutting the deep trenches 342 and extending to the buried layer 306. The self-aligned sinkers 322 extend laterally from the deep trenches 342 by a thickness 324 of less than 2.5 microns, which may advantageously enable a reduced size of the semiconductor device 300 compared to a semiconductor device using conventional sinkers.

The layer of pad oxide 346 of FIG. 3D may be removed, for example by a wet etch using a dilute buffered aqueous solution of hydrofluoric acid. A dielectric liner 316 is formed on sides and bottoms of the deep trenches 342. The dielectric liner 316 may be formed by thermal oxidation and may be, for example, 50 nanometers to 500 nanometers thick. Alternatively, the layer of pad oxide 346 may be increased by further thermal oxidation to form the dielectric liner 316.

A layer of trench fill material 344 is formed in the deep trenches 342 on the dielectric liner 316, and overlying the layer of hard mask oxide 330. In the instant example, the layer of trench fill material 344 may be silicon dioxide, formed by a PECVD process using TEOS in the deep trenches 342 and extending over the layer of hard mask oxide 330. Alternatively, the layer of trench fill material 344 may be polysilicon.

Figure 3F:
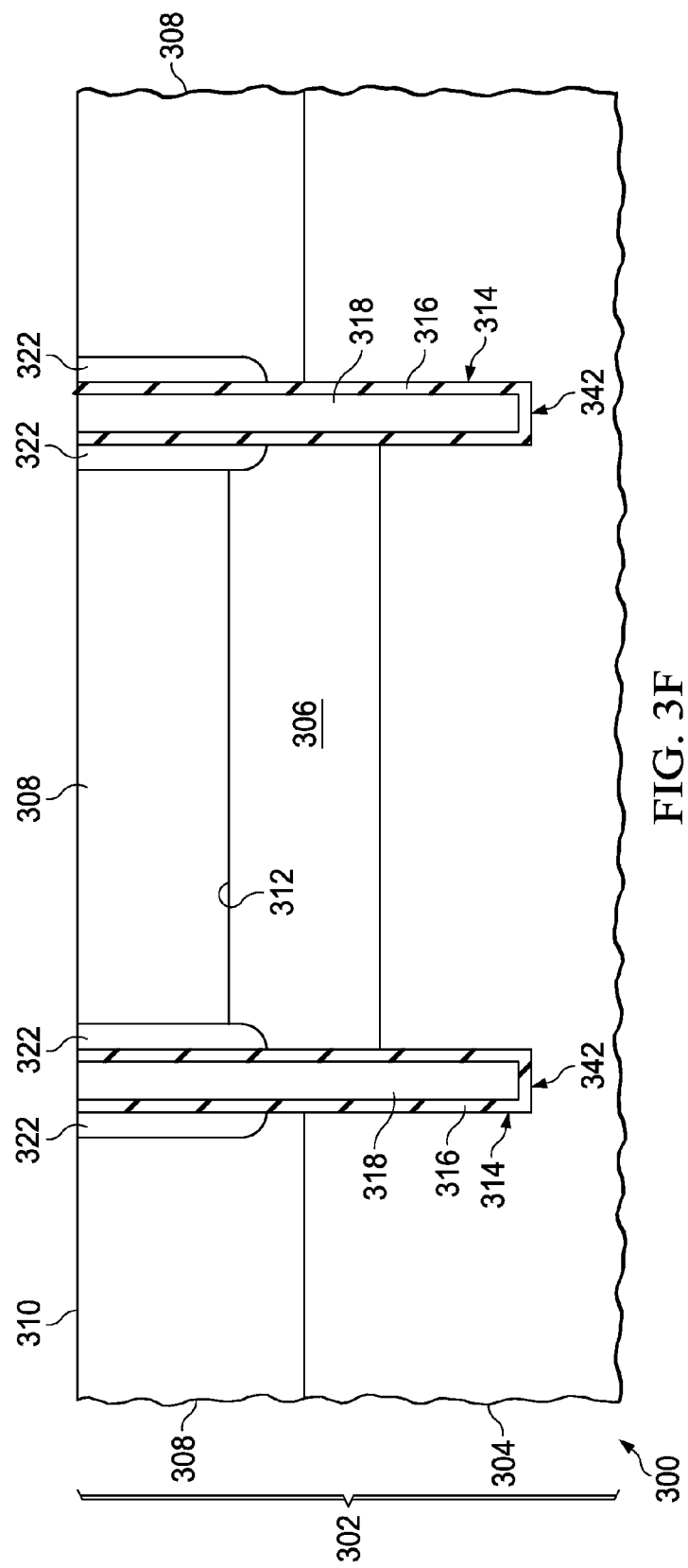

Referring to FIG. 3F, the layer of hard mask oxide 330 and the overlying portion of the layer of trench fill material 344 of FIG. 3E are removed, for example by a CMP process, leaving the layer of trench fill material 344 of FIG. 3E in the deep trenches 342 to provide trench fill material 318. The deep trenches 342 with the dielectric liner 316 and the trench fill material 318 provide deep trench structures 314 of the semiconductor device 300. The layer of pad nitride 328 and the layer of pad oxide 326 of FIG. 3E are subsequently removed.

Figure 4:
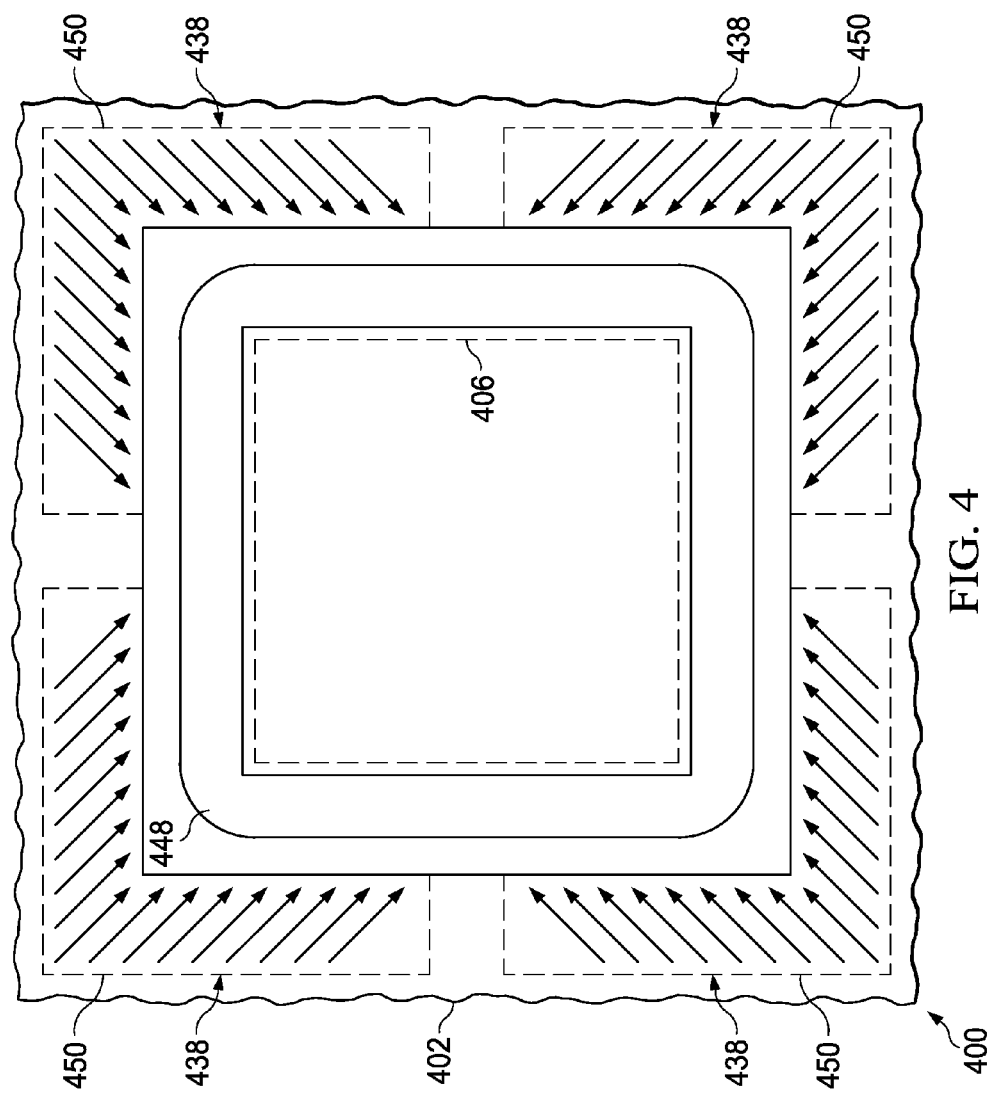
FIG. 4 is a top view of an example semiconductor device containing a buried layer and a deep trench with a self-aligned sinker to the buried layer, depicted during implantation of dopants to form sinker implanted layers.

FIG. 4 is a top view of an example semiconductor device containing a buried layer and a deep trench with a self-aligned sinker to the buried layer, depicted during implantation of dopants to form sinker implanted layers. The semiconductor device 400 is formed in a substrate 402 as described in reference to FIG. 1. The substrate 402 includes a buried layer 406; in the instant example, the buried layer 406 is localized. A trench 448, which may be a partial deep trench as described in reference to FIG. 2C or a deep trench as described in reference to FIG. 3B, is formed in the substrate 402. In the instant example, the buried layer 406 extends to, and abuts, the trench 448, which surrounds the buried layer 406. Dopants 438 are implanted in 4 sub-doses 450 separated by 90 degrees, at tilt angles of greater than 10 degrees, and twist angles of about 45 degrees. Implanting the dopants 438 in sub-doses at twist angles of about 45 degrees advantageously reduces an amount of the dopants 438 which are implanted in unwanted areas, such as a bottom of the trench 448 in the case of a partial deep trench or below the buried layer 406 in the case of a deep trench.

Figure 5:
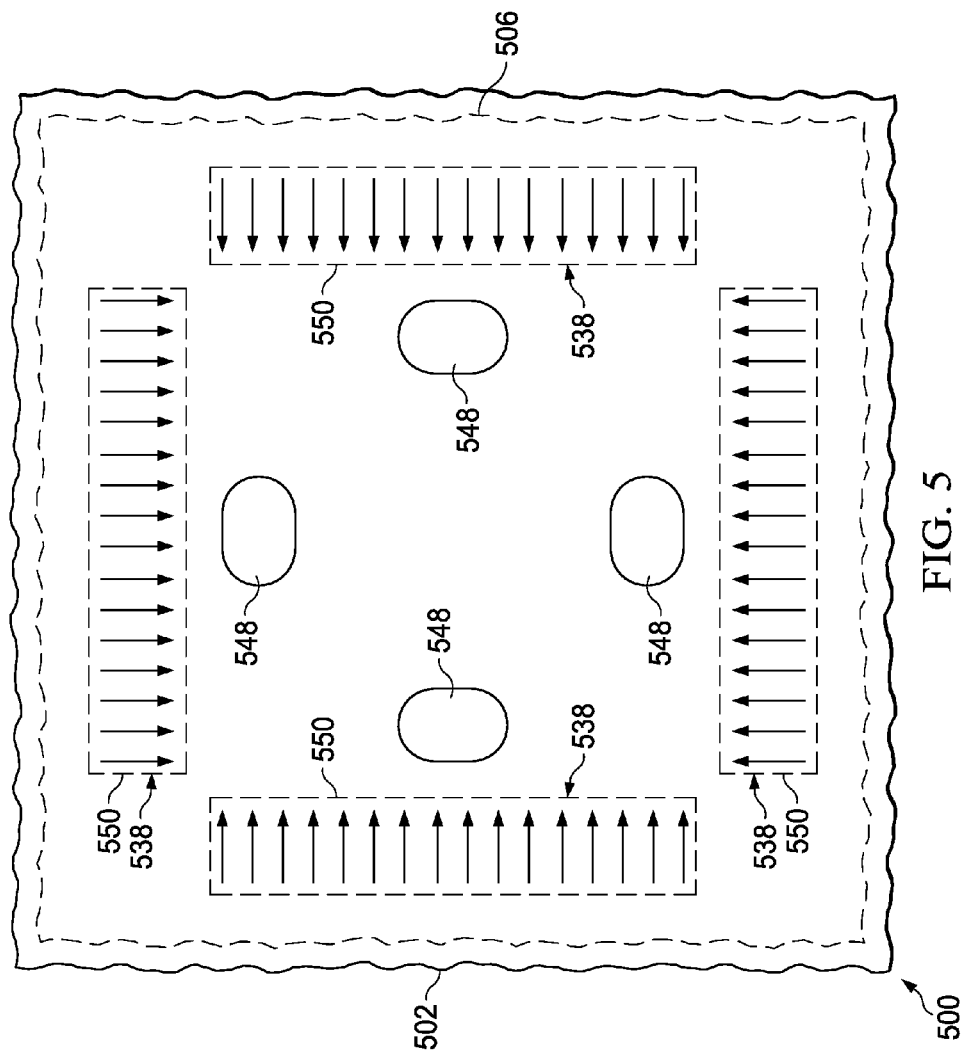
FIG. 5 is a top view of another example semiconductor device containing a buried layer and a deep trench with a self-aligned sinker to the buried layer, depicted during implantation of dopants to form sinker implanted layers.

FIG. 5 is a top view of another example semiconductor device containing a buried layer and a deep trench with a self-aligned sinker to the buried layer, depicted during implantation of dopants to form sinker implanted layers. The semiconductor device 500 is formed in a substrate 502 as described in reference to FIG. 1. The substrate 502 includes a buried layer 506; in the instant example, the buried layer 506 extends across the substrate 502. A plurality of trenches 548, which may be partial deep trenches or deep trenches, are formed in the substrate 502 to contact the buried layer 506. In the instant example, the trenches have a lateral length:width ratio of less than 2:1. Dopants 538 are implanted in 4 sub-doses 550 separated by 90 degrees, at tilt angles of greater than 10 degrees, and twist angles of about 0 degrees. The dopants 538 may be implanted at twist angles of about 0 degrees without implanting the dopants 538 in unwanted areas, such as a bottom of the trench 548 in the case of a partial deep trench or below the buried layer 506 in the case of a deep trench, due to the low length:width ratio. Alternatively, the dopants may be implanted at twist angles of about 45 degrees, which may be advantageous if other deep trench structures in the semiconductor device 500 are being concurrently implanted.

Figure 6:
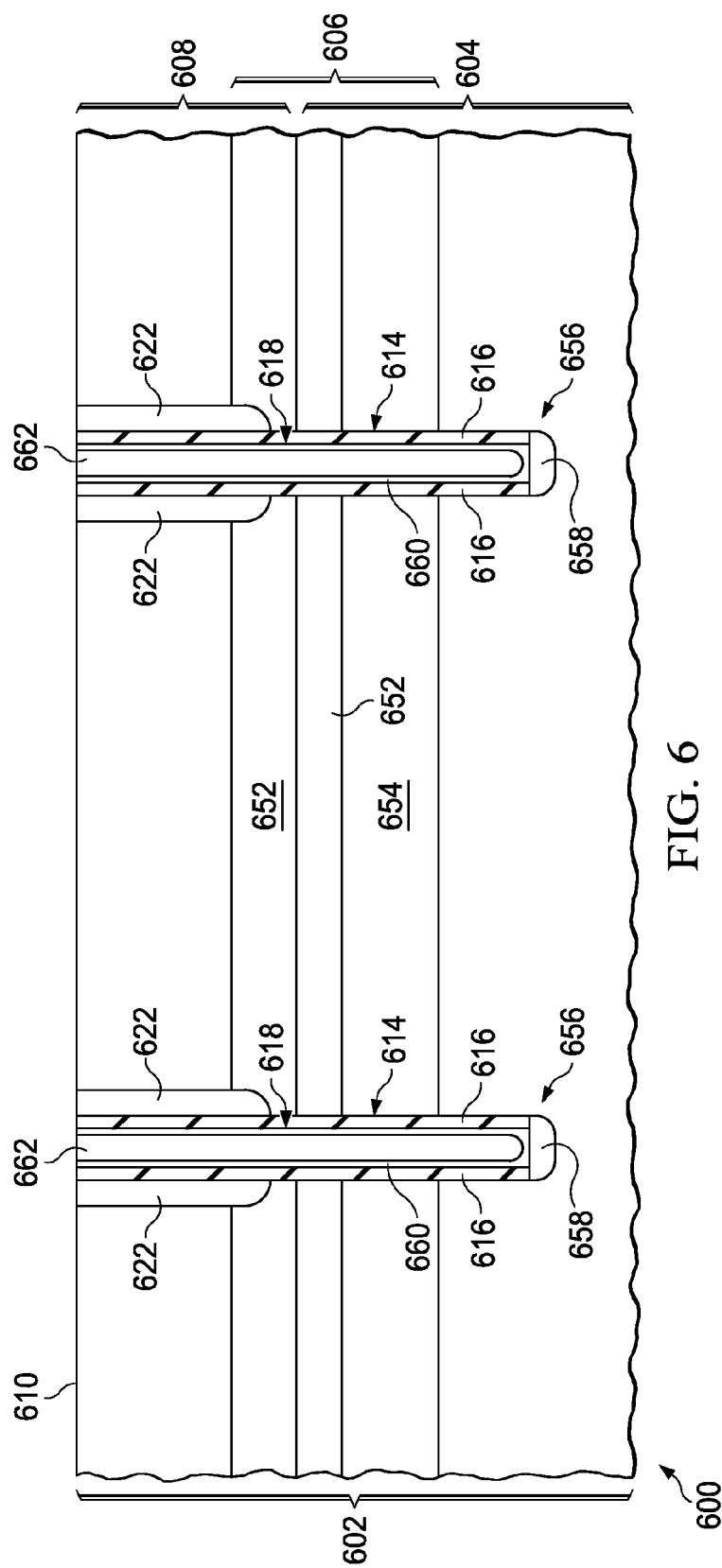
FIG. 6 is a cross section of an alternate semiconductor device containing a buried layer and deep trench structures with a self-aligned sinker to the buried layer.

FIG. 6 is a cross section of an alternate semiconductor device containing a buried layer and deep trench structures with a self-aligned sinker to the buried layer. The semiconductor device 600 is formed in a substrate 602 comprising a p-type base semiconductor layer 604 of semiconductor material, an n-type buried layer 606 of semiconductor material and a p-type upper semiconductor layer 608 extending to a top surface 610 of the substrate 602. The p-type base semiconductor layer 604 may be an epitaxial semiconductor layer with a resistivity of 5 ohm-cm to 10 ohm-cm. The p-type upper semiconductor layer 608 may also be an epitaxial semiconductor layer with a resistivity of 5 ohm-cm to 10 ohm-cm. The n-type buried layer 606 may include a main layer 652 which straddles the boundary between the base semiconductor layer 604 and the upper semiconductor layer 608, extending at least a micron into the base semiconductor layer 604 and at least a micron into the upper semiconductor layer 608. The n-type buried layer 606 may also include a lightly-doped layer 654 extending at least 2 microns below the main layer 652, disposed in the base semiconductor layer 604. The n-type buried layer 606 may be formed as described in the commonly assigned patent application having patent application Ser. No. 14/555,330, filed concurrently with this application, and which is incorporated herein by reference.

One or more deep trench structures 614 are disposed in the substrate 602, extending below the buried layer 606 into the base semiconductor layer 604. The deep trench structures 614 include dielectric liners 616 contacting the substrate 602. The deep trench structures 614 include electrically conductive trench fill material 618 on the dielectric liners 616. In the instant example, the dielectric liner 616 is removed at bottoms 656 of the deep trench structures 614 and the trench fill material 618 extends to the substrate 602, making electrical connection to the substrate 602 through a p-type contact region 658. The contact region 658 and the method of removing the dielectric liner 616 at the bottom 656 of each deep trench structure 614 may be done as described in the commonly assigned patent application having patent application Ser. No. 14/555,359, filed concurrently with this application, and which is incorporated herein by reference.

In the instant example, the trench fill material 618 includes a first layer of polysilicon 660 disposed on the dielectric liner 616, extending to the bottom 656 of the deep trench structure 614, and a second layer of polysilicon 662 is disposed on the first layer of polysilicon 660. Dopants are distributed in the first layer of polysilicon 660 and the second layer of polysilicon 662 with an average doping density of at least $1 \times 10^{18}$ cm$^{-3}$. The trench fill material 618 may be formed as described in the commonly assigned patent application having patent application Ser. No. 14/555,300, filed concurrently with this application, and which is incorporated herein by reference.

N-type self-aligned sinkers 622 are disposed in the upper semiconductor layer 608 abutting the deep trench structures 614 and extending to the buried layer 606. The self-aligned sinkers 622 provide electrical connections to the buried layer 606. The self-aligned sinkers 622 may be formed as described in any of the examples herein.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a semiconductor device, comprising the steps:

providing a substrate comprising semiconductor material;

forming a buried layer in the substrate so that the buried layer has a first conductivity type and a top surface of the buried layer is at least 2 microns below a top surface of the substrate;

forming a partial deep trench less than 6 microns wide in the substrate extending down to the buried layer, so that the partial deep trench does not extend below a bottom surface of the buried layer;

implanting dopants into the substrate along sidewalls of the partial deep trench to form a sinker implanted layer extending down to the buried layer, the sinker implanted layer having the first conductivity type;

removing material from the substrate so as to extend the partial deep trench below the bottom surface of the buried layer to form a deep trench;

forming a dielectric liner in the deep trench on sidewalls of the deep trench, contacting the substrate; and activating the dopants in the sinker implanted layer to form a self-aligned sinker having the first conductivity type disposed in the substrate and abutting the deep trench structure, extending down to the buried layer, and extending laterally from the deep trench structures by a thickness of less than 2.5 microns.

2. The method of claim 1, wherein:

the buried layer is n-type; and the dopants implanted to form the sinker implanted layer include phosphorus.

3. The method of claim 1, comprising forming a pad oxide layer on sidewalls of the partial deep trench before implanting the dopants, and wherein:

the buried layer is n-type; and the dopants include arsenic.

4. The method of claim 1, wherein the dopants implanted to form the sinker implanted layer are implanted at tilt angles greater than 10 degrees.

5. The method of claim 1, wherein the dopants implanted to form the sinker implanted layer are implanted at twist angles of about 45 degrees.

6. The method of claim 1, comprising annealing the substrate to activate the dopants implanted to form the sinker implanted layer before forming the deep trench.

7. The method of claim 1, wherein the dopants implanted to form the sinker implanted layer have a total dose of $1 \times 10^{15}$ cm$^{-2}$ to $2 \times 10^{16}$ cm$^{-2}$.

* * * * *